United States Patent [19]

Baron et al.

[11] Patent Number: 4,731,610

[45] Date of Patent: Mar. 15, 1988

[54] BALANCED DRIVE ELECTRONIC MATRIX SYSTEM AND METHOD OF OPERATING THE SAME

[75] Inventors: Yair Baron; Walter E. Chapelle, both of Southfield; Shui-Chih A. Lien, Troy; Clive Catchpole, Birmingham, all of Mich.

[73] Assignee: Ovonic Imaging Systems, Inc., Troy, Mich.

[21] Appl. No.: 821,023

[22] Filed: Jan. 21, 1986

[51] Int. Cl.[4] .............................................. G09G 3/34
[52] U.S. Cl. ...................................... 340/784; 340/719; 340/752; 340/765
[58] Field of Search ............... 340/784, 719, 765, 783, 340/752; 350/330

[56] References Cited

U.S. PATENT DOCUMENTS

| | | | |
|---|---|---|---|
| 3,653,745 | 4/1972 | Mao | 340/765 |
| 3,654,606 | 4/1972 | Marlowe et al. | 340/784 |
| 3,765,747 | 10/1973 | Pankratz et al. | 340/784 |
| 4,198,630 | 4/1980 | Serinken et al. | 340/784 |
| 4,223,308 | 9/1980 | Baraff et al. | 340/784 |
| 4,245,168 | 1/1981 | Waldron | 340/784 |
| 4,251,136 | 2/1981 | Miner et al. | 340/784 |
| 4,319,237 | 3/1982 | Matsuo et al. | 340/784 |
| 4,342,994 | 8/1982 | Lorteije | 340/784 |
| 4,582,395 | 4/1986 | Morzumi | 340/784 |
| 4,644,338 | 2/1987 | Aoki et al. | 340/784 |

Primary Examiner—Marshall M. Curtis
Assistant Examiner—Mahmoud Fatahi-yar
Attorney, Agent, or Firm—Marvin S. Siskind; Richard M. Goldman

[57] ABSTRACT

An electronic matrix system and method for rapidly storing and efficiently retaining electric charge in selected ones of a plurality of storage elements are disclosed. Each storage element is addressable through a pair of parallel row select address lines and a column address line. A pair of threshold devices are coupled in nonopposing relation between the row select address lines and the storage element is coupled between the common node of the threshold devices and the column address line to which charging potential is applied. During the charging of the storage element, operating potentials which are substantially equal and opposite in polarity are applied to the row select line pair to forward bias both threshold devices and thereafter operating potentials which are also substantially equal and opposite in polarity are applied to the row select line pair to back bias both threshold devices to provide retention of the charge in the storage element.

20 Claims, 9 Drawing Figures

FIG. 4
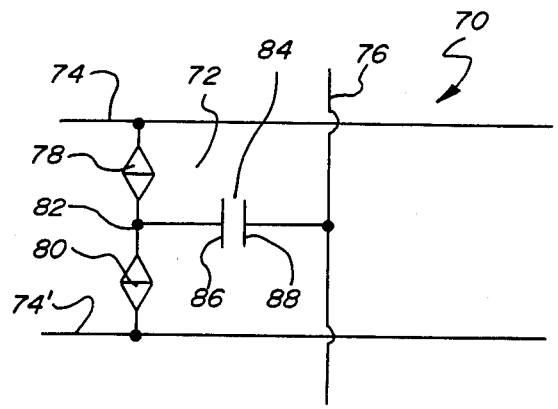
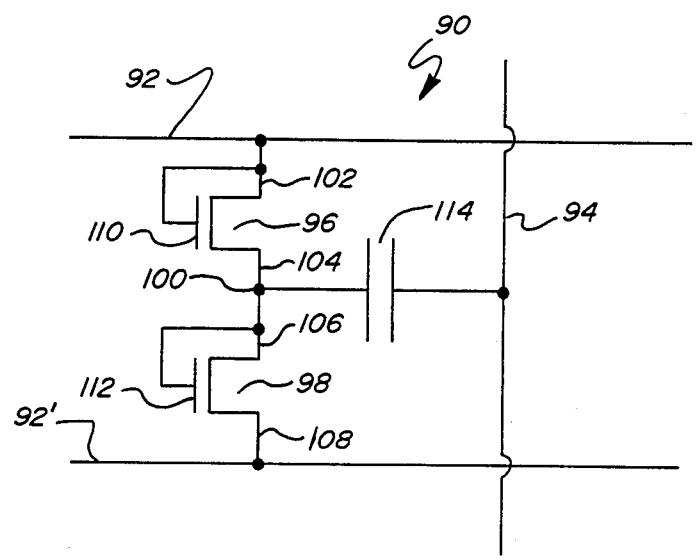
FIG. 5

BALANCED DRIVE ELECTRONIC MATRIX SYSTEM AND METHOD OF OPERATING THE SAME

BACKGROUND

The present invention generally relates to an electronic matrix system and method of operating the same. The present invention more particularly relates to a matrix system which includes a plurality of storage elements capable of storing electronic charge and a drive means and method for rapidly storing electric charge in selected storage elements and efficiently retaining the charge stored therein. The present invention is particularly useful in light influencing displays wherein the storage elements take the form of display picture elements and is also useful in other applications, such as in memory matrices.

In many electronic matrix systems, an array of storage elements, each having a unique address, are utilized for storing electric charge. Such matrix systems can include memory arrays and light influencing displays, for example. In light influencing displays, the storage elements take the form of picture elements. The picture elements or pixels generally include a pair of spaced apart and facing electrodes and light influencing material disposed between the electrodes. As a result, each pixel consititutes a capacitor in which electric charge can be stored. The charge stored in a pixel results in a voltage potential across the electrodes and an electric field across the light influencing material. By controlling the amount of charge stored, the properties of the light influencing material can in turn be controlled to obtain a desired light influencing effect.

When the light influencing material is liquid crystal material, alignment of the liquid crystal material molecules can be obtained when the field applied to the material is above a threshold value. As well known, liquid crystal displays generally include polarizers disposed on both sides of the display and alignment layers disposed on both sides of the liquid crystal display material. When the field across the liquid crystal display material is above the threshold value, a pixel can be made light transmissive or light absorptive depending on the relative alignment of the polarizers and alignment layers and when the field is below the threshold value, an opposite light influencing effect can be obtained. Because a display generally includes many pixels, an image can be formed by selectively controlling which pixels are transmissive to light and which pixels are absorptive to light.

In liquid crystal displays, it is necessary to update the condition of each pixel at regular intervals, for example, at a frame rate of thirty frames per second. This is required because the pixels can retain or store the applied potentials for a finite time. Updating is also required when nematic liquid crystal display material is employed because the sense of the applied potential must be reversed during alternate frames to avoid degradation of such liquid crystal display material. Updating is further required when the displayed images are intended to change regularly, such as when the displayed images are constantly moving. Hence, the ability to rapidly transfer to and store electric charge in the pixels and to efficiently retain the stored charge for at least one frame period is essential.

To accurately drive the pixels of liquid crystal displays, active matrices have been utilized. In such active matrices, each pixel is associated with one or more threshold devices through which the potential to be stored in the pixel is applied to the pixel. The threshold devices can take the form of field effect transistors or diodes, for example.

Active matrix liquid crystal displays employing diodes as the threshold devices are disclosed, for example, in copending U.S. patent applications Ser. Nos. 573,004, and 675,941 filed Jan. 23, 1984 and Dec. 3, 1984 respectively, in the names of Zvi Yaniv, Vincent D. Cannella, Gregory L. Hansell, and Louis D. Swartz, for Liquid Crystal Displays Operated By Amorphous Silicon Alloy Devices both of which are incorportated herein by reference. In accordance with at least one embodiment disclosed therein, each pixel includes a pair of diodes coupled in nonopposing relation between an address line pair and at a common node. One electrode of the pixel is coupled to the common node and the other electrode is coupled to another address line or data line to which the pixel charging potential is applied. A nematic liquid crystal display material is disposed between the electrodes. When charging potential is applied to a pixel, one diode is biased off and the other diode is biased on by potentials applied to the address line pair and to the data line. Hence, to charge the pixel, the charging potential is applied through one of the diodes. As a result, the nonlinear characteristics of the diode which is on must be overcome to provide the pixel with enough current to charge the pixel. The voltage drop across the diode must be overcome to provide this current and the charge potential must also be applied for sufficient time to accommodate the series resistance imposed by the diode. Also, during the next frame, the state of the diodes is reversed to accommodate the reversal in the charge potential polarity. This can cause the voltage at the common node to vary. Such variance in the potential at the common node presents difficulties in controlling the ultimate voltage to which the pixel is to be charged and can adversely affect gray scale operation of the display. Also, it can be understood that a reverse biased active device, such as a diode, for example, collects a certain amount of charge because of its internal capacitance. Under dynamic conditions, this unwanted charge must be taken into account when driving a pixel. Otherwise, an improper voltage will be applied across the pixel itself.

In addition to the foregoing problems, it is difficult to manufacture a very large area electronic matrix, such as a large area display, whose devices have precisely the same I–V characteristics over the entire length and width of the matrix. Thus, voltages applied to one pixel to achieve a particular gray scale effect or level may not product the exact same gray scale effect or level when applied to other pixels, especially those located some distance away from the one pixel.

SUMMARY

The invention provides an electronic matrix system for rapidly storing and efficiently retaining electric charge in selected ones of a plurality of storage elements. The system includes a plurality of substantially parallel address line pairs, a plurality of substantially parallel additional address lines crossing the address line pairs at an angle and being spaced from the address line pairs to form a plurality of crossover points therewith, and a pair of threshold devices coupled together at a common node and in nonopposing series relation between the address line pairs associated with the crossover points. The threshold devices are of the type which provide a low impedance to current flow when biased into a first condition and each of the storage elements is coupled between a respective one of the common nodes and one of the additional address lines. The system further includes first means for applying first operating potentials which are substantially equal in magnitude and opposite in polarity between the address line pairs to bias the threshold devices into the first condition for facilitating the storage of charge in the storage elements coupled thereto and second means for applying charging potential to selected ones of the additional address lines for providing electric charge to be stored in the selected storage elements during the application of the first operating potentials to the address line pairs.

The threshold devices can also be of the type which provide a high impedance to current flow when biased into a second condition and said first means can further include means for applying second operating potentials which are substantially equal in magnitude and opposite in polarity between the address line pairs to reverse bias the threshold devices for facilitating the retention of the charge stored in the storage elements coupled thereto.

The invention further provides a method of operating an electronic matrix system to rapidly store and efficiently retain electric charge in selected ones of a plurality of storage elements of the matrix system. The method includes the steps of providing a plurality of substantially parallel address line pairs, providing a plurality of substantially parallel additional address lines crossing the address line pairs at an angle and being spaced from the address line pairs to form a plurality of crossover points therewith, and coupling a pair of threshold devices together at a common node and in nonopposing series relation between the address line pairs associated with the crossover points. The threshold devices are of the type which provide a low impedance to current flow when biased into a first condition. The method further includes the steps of coupling each of the storage elements between a respective one of the common nodes and one of the additional address lines, applying first operating potentials which are substantially equal in magnitude and opposite in polarity between the address line pairs to bias the threshold devices into the first condition to facilitate the storage of charge in the storage elements coupled thereto, and applying charging potential to selected ones of the additional address lines during the application of the first operating potentials to the address line pairs to store electric charge in the selected storage elements.

The threshold devices can also be of the type which provide a high impedance to current flow when biased into a second condition, and the method can further include the step of applying second operating potentials which are substantially equal in magnitude and opposite in polarity between the address line pairs to bias the threshold devices into the second condition to facilitate the retention of the charge stored in the storage elements coupled thereto.

BRIEF DESCRIPTION OF THE DRAWINGS

FIG. 4 is a partial schematic circuit diagram of another electronic matrix embodying the present invention; and FIG. 5 is a partial schematic diagram of a still further electronic matrix embodying the present invention.

DESCRIPTION OF THE PREFERRED EMBODIMENTS

Figure 1:
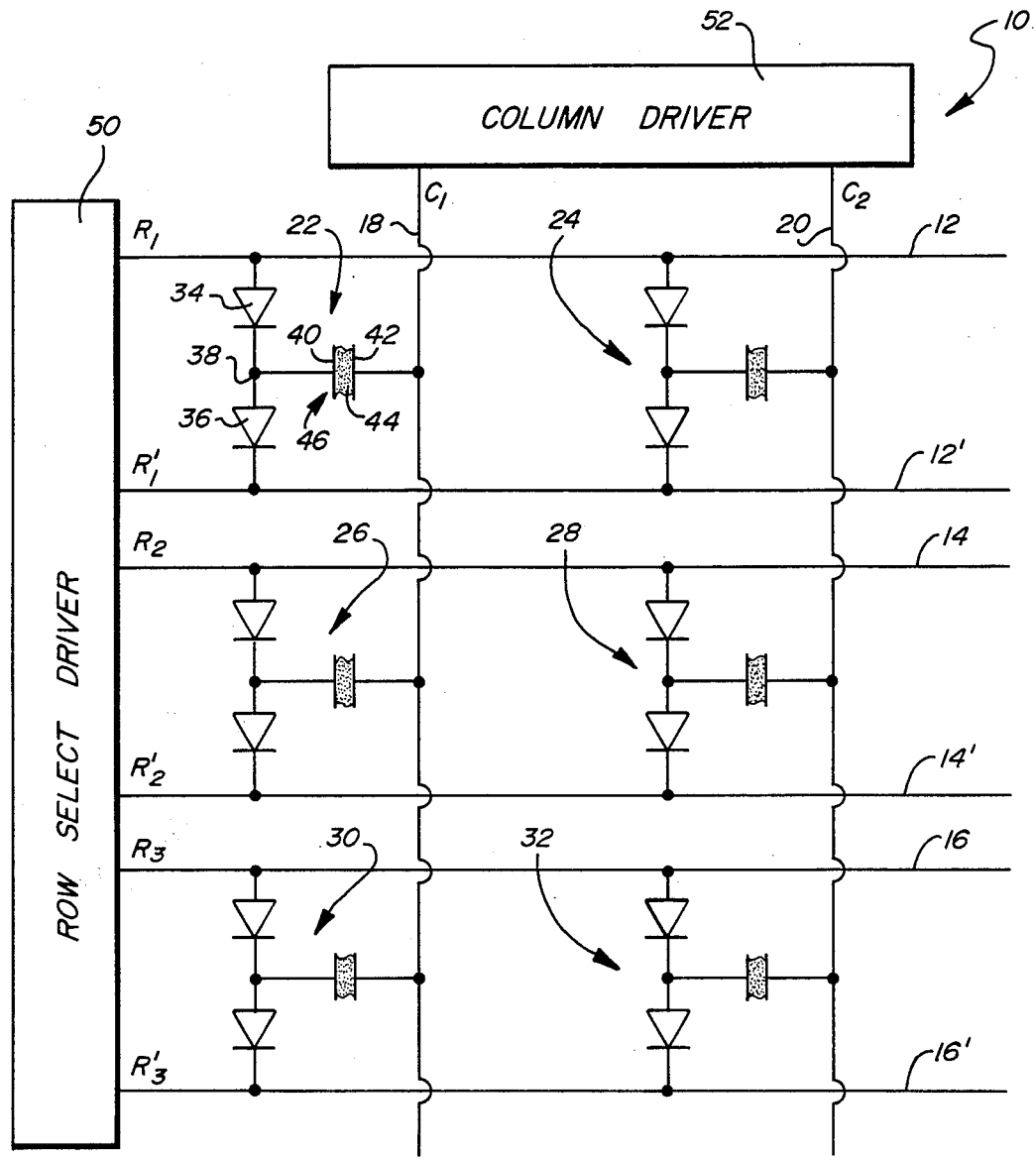
FIG. 1 is a schematic circuit diagram of an electronic matrix system embodying the present invention.

Referring now to FIG. 1, it illustrates in schematic circuit diagram form an electronic matrix system 10 embodying the present invention. For purposes of this preferred embodiment, the electronic matrix system 10 takes the form of a light influencing display, and more particularly, a liquid crystal display. The system 10 includes a plurality of substantially parallel address line pairs 12, 12', 14, 14', 16, and 16' which are row select lines, and a plurality of substantially parallel additional or column address lines 18 and 20. The column address lines 18 and 20 cross the row select address line pairs at an angle and are spaced from the row select address line pairs to form a plurality of crossover points therewith. Preferably, the column address lines 18 and 20 cross the row select address line pairs substantially perpendicularly thereto.

The system further includes a pixel at each of the crossovers defined by the crossing row select lines and the column address lines. To that end, the system includes pixels 22, 24, 26, 28, 30, and 32. Although just six pixels are illustrated, it is of course to be understood that the system 10 includes additional row select line pairs and column address lines with a corresponding additional number of pixels arranged in rows and columns to provide a display having a sufficient number of pixels so as to form a usable image.

Since the pixels are preferably substantially identical, only pixel 22 will be described in detail herein. Pixel 22, as can be seen in the figure, includes a pair of threshold devices 34 and 36 which are coupled together at a common node 38. The threshold devices 34 and 36 take the form of diodes and are coupled together in nonopposing series relation between the row select address line pair 12 and 12'. Although the threshold devices in accordance with this preferred embodiment take the form of diodes, in practicing the present invention, the threshold devices can be any threshold device of the type which provides a high impedance to current flow when reversed biased and a comparatively low impedance to current flow when forward biased. As will be described subsequently with respect to the embodiments of FIGS. 4 and 5, it will be noted that the threshold devices in accordance with those embodiments take the form of bidirectional threshold devices and field effect transistors.

The pixel 22 further includes a pair of electrodes 40 and 42 which are spaced apart and facing one another. Between the electrodes 40 and 42 is a light influencing material 44. The term "light influencing material" is meant to include any material which emits light or can be used to selectively vary the intensity, phase, or polarization of light either being reflected from or transmitted through the material. In accordance with this preferred embodiment, the light influencing material 44 is liquid crystal display material, such as a nematic liquid crystal material.

The electrodes 40 and 42 with the liquid crystal display material 44 disposed therebetween form a storage element 46 or capacitor in which electric charge can be stored. The storage element 46 is coupled between the common node 38 formed by the diodes 34 and 36 and to the column address line 18.

The diodes 34 and 36 are preferably formed from layers of deposited semiconductor materials, and preferably, amorphous semiconductor alloy materials. Reference can be made to the aforementioned copending U.S. patent application Ser. No. 573,004 for structural details of the liquid crystal display and the manner in which it can be fabricated. However, it might be mentioned herein that the diodes 34 and 36 are preferably formed as PIN diodes which include a layer of doped amorphous silicon alloy, a substantially intrinsic amorphous silicon alloy overlying the doped layer, and a further doped layer of amorphous silicon alloy overlying the substantially intrinsic layer.

The system 10 further includes a row select driver 50 having outputs $R_1$, $R_1'$, $R_2$, $R_2'$, $R_3$, and $R_3'$ coupled to the row select address line pairs 12, 12', 14, 14', 16, and 16'. The row select driver 50, as will be described subsequently, provides drive signals at its outputs to apply first operating potentials which are substantially equal in magnitude and opposite in polarity between the row select address line pairs to forward bias the threshold devices to in turn facilitate the storage of charge in the storage elements coupled thereto. The row select driver also applies second operating potentials which are substantially equal in magnitude and opposite in polarity between the row select address line pairs to reverse bias the threshold devices to facilitate the retention of the charge stored in the storage elements coupled thereto.

Lastly, the system 10 includes a column driver 52. The column driver 52 includes a plurality of outputs, $C_1$ and $C_2$, which are coupled to the column address lines 18 and 20 respectively. The column driver applies charging potential to selected ones of the column address lines for providing electric charge to be stored in selected storage elements during the application of the first operating potentials to the row select address line pairs by the row select driver 50.

Figure 2A:
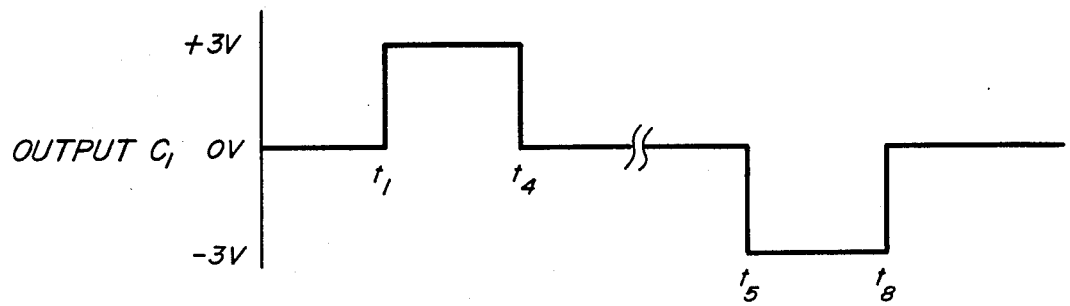
FIG. 2A is an illustrative waveform of the signals provided at output $C_1$ of the column driver of FIG. 1.
Figure 2B:
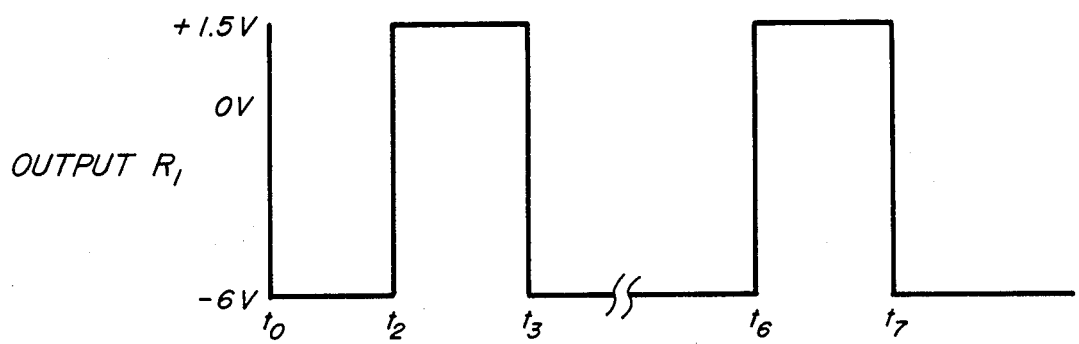
FIGS. 2B and 2C are illustrative waveforms of the row select signals provided at outputs $R_1$ and $R_1'$ respectively of the row select driver of FIG. 1.
Figure 2C:
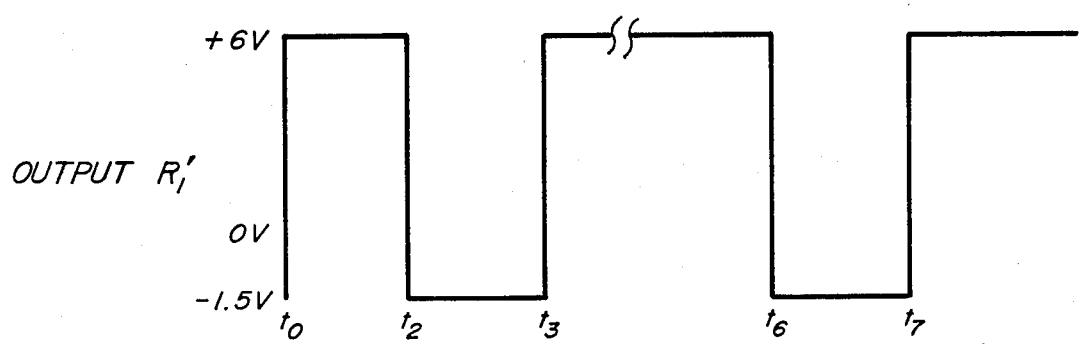

Referring now to FIGS. 2A, 2B, and 2C, they collectively illustrate the manner in which charge is stored in the storage element 46 of pixel 22 and thereafter retained therein. More specifically, FIG. 2A illustrates the waveform of the signal provided at output $C_1$ of the column driver 52, FIG. 2B illustrates the waveform of the signal provided at output $R_1$ of the row select driver 50, and FIG. 2C illustrates the waveform of the signal provided at output $R_1'$ of the row select driver 50.

At $t_0$, the row select driver 50 applies $-6$ volts to the row select address line 12 and $+6$ volts to row select line 12' to back bias the diodes 34 and 36. With the diodes 34 and 36 thus back biased, any charge previously stored in the storage element 46 is retained therein. In the immediately succeeding frame, if charge is to be once again stored in the storage element 46, the column driver 52 provides at its output $C_1$ which is coupled to the column address line 18 a $+3$ volts at $t_1$. Immediately thereafter, the row select driver 50 provides at $t_2$ a $+1.5$ volts to row select line 12 and a $-1.5$ volts to row select line 12'. Hence, the row select driver has provided at $t_2$ operating potentials to the address line pair formed by lines 12 and 12' which are substantially equal in magnitude and opposite in polarity to forward bias the diodes 34 and 36. With the diodes 34 and 36 forward biased, the $+3$ volts applied to electrode 42 of the storage element 46 will charge the storage element 46 through a current path which extends from the column address line 18, through the storage element 46, and through the diode 36.

At $t_3$, the storage element 46 is charged to an extent sufficient to exceed the threshold voltage of the liquid crystal display material 44 and the row select driver 50 returns the row select line 12 to a $-6$ volts and the row select line 12' to a $+6$ volts to back bias the diodes 34 and 36. Immediately thereafter at $t_4$, the column driver 52 terminates the charging potential of $+3$ volts and the column address line 18 returns to 0 volts. During the time in which the storage element 46 is being charged, the row select driver 50 applies to the other row select address lines operating potentials which back bias the diodes coupled between the other row select address line pairs. It is preferred that all of the storage elements within the row defined by the row select address line pairs 12 and 12' are charged in parallel so that once these storage elements are charged, the next row defined by the row address lines 14 and 14' can be selected by the row select driver 50 to forward bias the diodes coupled therebetween. Hence, during the time in which the storage elements of the row defined by the row select lines 12 and 12' are charged, the other row select lines are provided with operating potentials from the row select driver 50 to back bias the diodes coupled therebetween. To that end, as the storage element 46 is charged, the row select address lines 14 and 16 receive from the row select driver a $-6$ volts and the row select lines 14' and 16' receive a $+6$ volts.

In accordance with this preferred embodiment, the liquid crystal display material 44 is a nematic liquid crystal display material and thus the sense of the potential applied thereto is preferably reversed during the next succeeding frame. This is illustrated at time $t_5$ where a $-3$ volts is impressed upon the column address line 18 by the column driver 52. Immediately thereafter at $t_6$, the row select driver 50 provides a $+1.5$ volts to row select line 12 and a $-1.5$ volts to the row select line 12'. This once again forward biases the diodes 34 and 36. The storage element 46 is now charged again but in a reverse direction through a path including the column address line 18, the storage element 46, and the diode 34. When the storage element 46 is charged to a potential above the threshold value of the liquid crystal display material 44, the row select driver at $t_7$ once again back biases the diodes 34 and 36. Immediately thereafter at $t_8$, the column driver 52 returns the column address line 18 to 0 volts. With the diodes 34 and 36 back biased, the charging potential will be retained within the storage element 46. Those in the art should appreciate that the diode pairs associated with the storage elements only need be forward biased sufficiently to establish a common node voltage which remains at approximately 0 volts as the individual storage elements are being charged to achieve the basic benefits of the present invention.

Figure 3A:
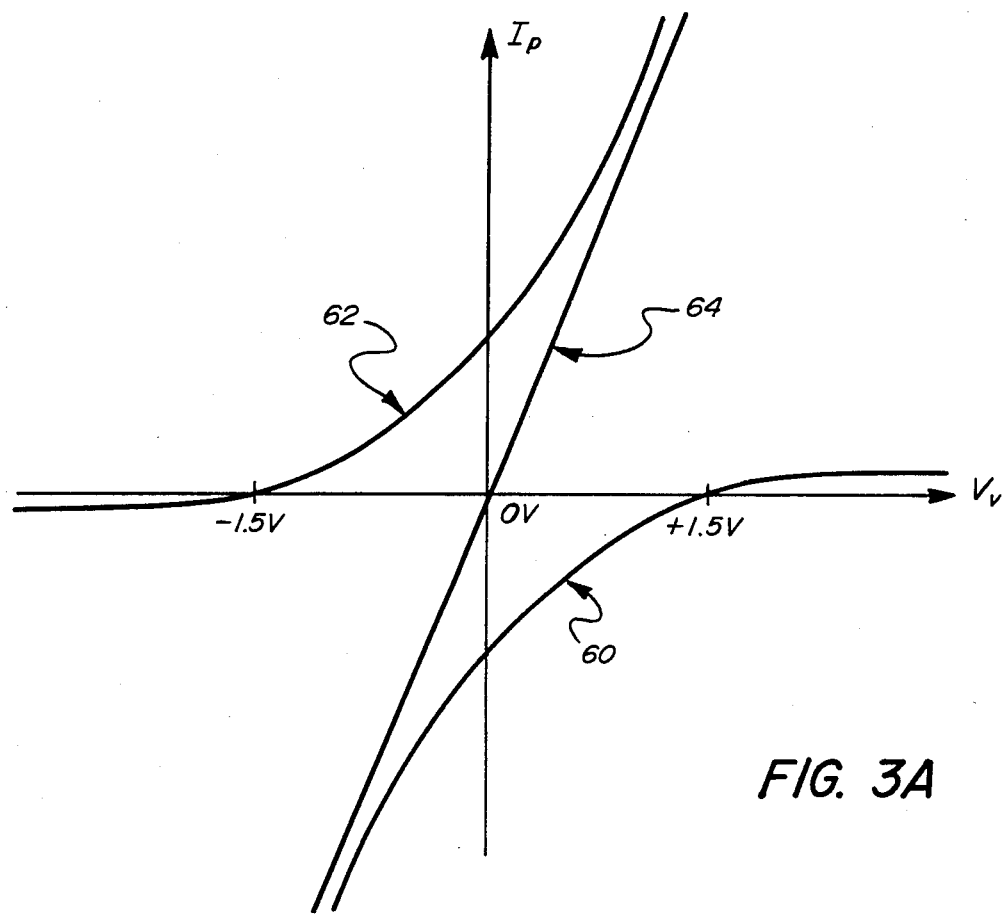
FIG. 3A is a current versus voltage curve to illustrate the operation and method of the present invention.

Referring now to FIG. 3A, the curves there shown dramatically illustrate the improved operation of the matrix in accordance with the present invention, when the diodes 34 and 36 of the pixel 22 of FIG. 1 are forward biased on during the charging of the charge storage element 46. For the purpose of interpreting the curves of FIG. 3A, $I_p$ is the current flowing into the common node 38 through the charge storage element 46 and $V_y$ is the voltage (e.g., such as a video drive signal) across element 46. Curve 60 is the current versus voltage characteristic of diode 34 alone when line 12 is maintained of +1.5 volts, and the impedance of pixel 22 is assumed to be 0 ohms. As can be noted, when the voltage $V_y$ becomes more negative than the 1.5 volts on line 12, the current increases nonlinearly in a negative direction. Similarly, curve 62 is the current versus voltage characteristic of diode 36 alone when line 12' is maintained at −1.5 volts and the impedance of pixel 22 is 0 ohms. As can be noted, when the voltage $V_y$ becomes more positive than the −1.5 volts on line 12', the current increases nonlinearly in a positive direction. Combining the curves 60 and 62 results in a "load" line curve 64 which represents the combined current versus voltage characteristic of diodes 34 and 36 when they are forward biased by having lines 12 and 12' maintained at +1.5 volts and −1.5 volts respectively. As can be noted, with both diodes forward biased, the curve 64 has a very steep slope showing that considerable current can flow through the storage element 46 when relatively low voltages are applied across the storage element. Alternatively stated, those in the art will appreciate that both diodes 34 and 36 are simultaneously conducting, since they are both forward biased. Since the current through storage element 46 will be only a fraction of the current flowing through diodes, the diodes will remain in their forward biased condition as element 46, and the voltage at node 38 will reamin at or very near 0 volts (typically within several tens of millivolts or less). The relatively sizable current through the diodes also means that effective impedance of node 38, as viewed from storage element 46, is considerable lower than in previous two diode pixel driving schemes, thus allowing much more rapid charging of the storage element 46 by the voltage impressed upon the column address line 18. As a result, when a pixel and its associated diodes of a liquid crystal display such as that illustrated in FIG. 1 is driven sufficiently hard in the manner indicated in FIG. 2, the initial nonlinear portion of I-V characteristics of the individual isolation devices may be substantially avoided.

Figure 3B:
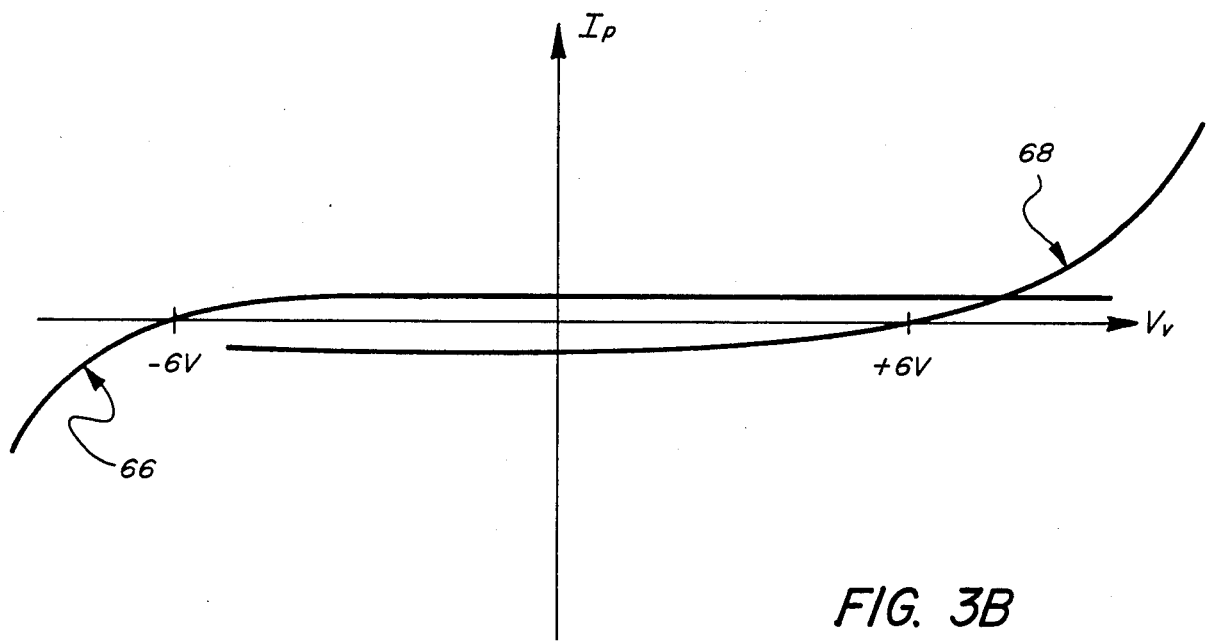
FIG. 3B is another current versus voltage curve to further illustrate the operation and method of the present invention.

Referring now to FIG. 3B, the curves there shown dramatically illustrate the improved operation of the matrix in accordance with the present invention when the diodes 34 and 36 of the pixel 22 of FIG. 1 are back biased during the retention of the charge stored within the charge storage element 46. Curve 66 is the current versus voltage characteristic of diode 34 alone when line 12 is held at −6 volts and impedance of storage element 46 is assumed to be 0 ohms. As can be noted, when the voltage $V_y$ is more positive than the −6 volts on line 12, the current through the diode 34 is represented by only leakage current, which typically is very low (e.g., orders of magnitude lower than the diodes on current). Similarly, curve 68 is the current versus voltage characteristic of diode 36 when line 12' is held at −6 volts and the impedance of element 46 is assumed to be 0 ohms. When the voltage across element 46 is less positive than the 6 volts on line 12', the current through the diode 36 is also represented by leakage current which is similarly very low. As a result, as long as the voltage across storage element 46 reamins between +6 volts and −6 volts (or other suitable voltages designed to reverse bias the diodes), very little current will flow from the charge storage element 46, and thus, the system will efficiently retain the charge stored within the charge storage element 46.

Figure 3C:
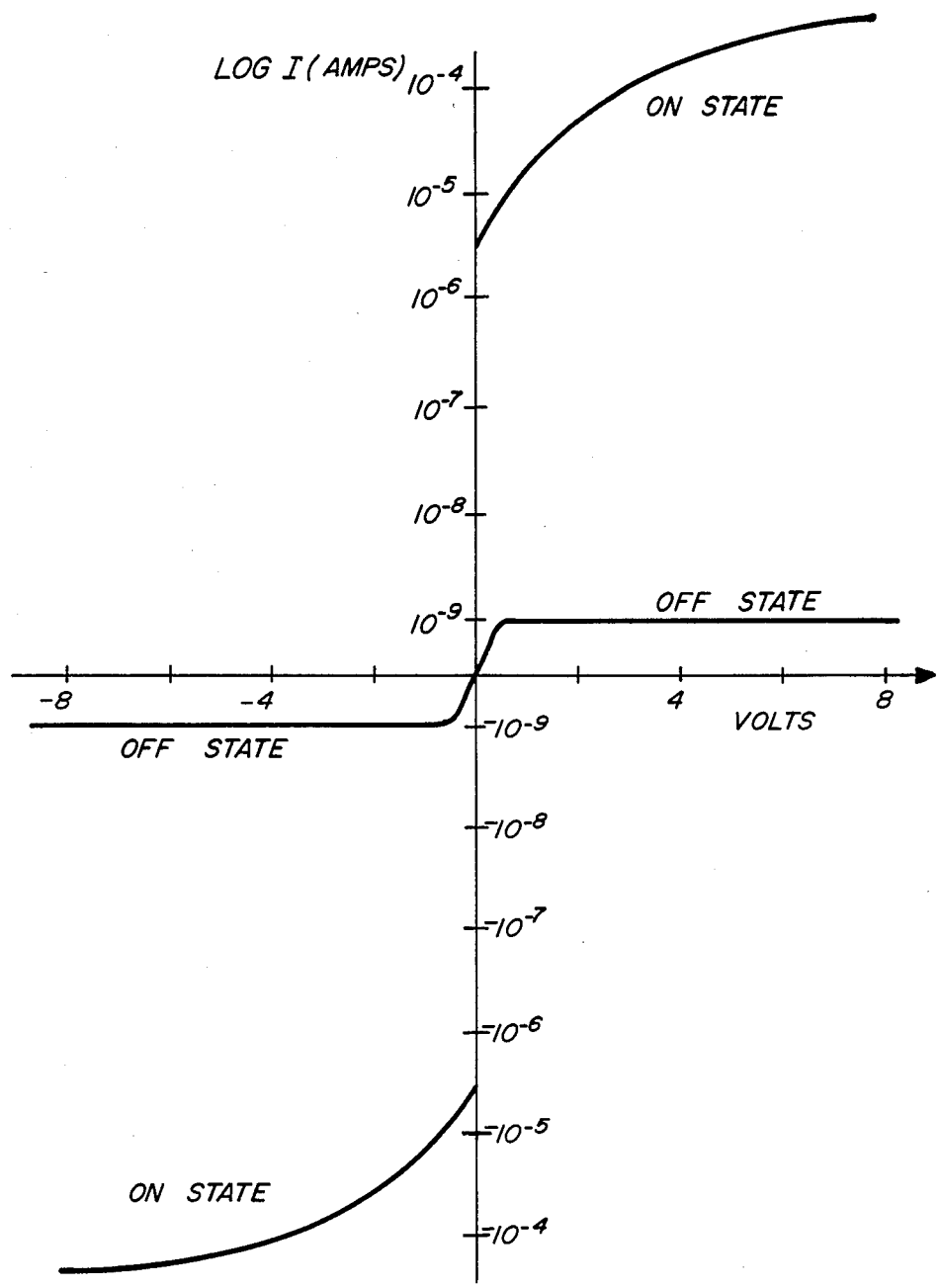
FIG. 3C is another current versus voltage curve illustrating the switching characteristics of the two diodes 34 and 36 when forward and reverse biased together in accordance with the present invention.

Referring now to FIG. 3C, there is shown one illustrative set of switching characteristics of the diodes 34 and 36 when the diodes are forward biased together (the on-state) and reverse biased together (the off-state) by substantially equal and opposite polarity voltages in accordance with the present invention. As clearly illustrated, when the diodes are forward biased "on" by a total potential difference of about 4 volts, they will conduct a current of $10^{-4}$ amps to permit rapid charging of the pixel 46. When reversed biased "off" by about 0.5 volts, the diodes will conduct only about $10^{-9}$ amps or less, so as to retain the charge stored in the pixel 46. As can also be noted, an on to off ratio of many orders of magnitude can be realized by the switching of diodes 34 and 36 between their forward and reversed biased condition in accordance with the present invention. The number of orders of magnitude by which the on and off currents vary also depends on how low the leakage current of the diodes is.

As can be seen from the foregoing, the system of the present invention can be referred to as a balanced drive system inasmuch as the operating potentials applied to the row select address line pairs are always substantially equal but opposite in polarity. Assuming that the diodes 34 and 36 have substantially identical I-V characteristics, a voltage value of substantially 0 volts will be maintained at the common node 38, at least when the diodes are forward biased. Thus the voltage applied on column line 18 to charge storage element 46 no longer need take into account the voltage drop across and/or parasitic charge build-up on one or both of the diodes 34 and 36 as in earlier two diode systems. Since the two diodes associated with each storage element will be formed close in proximity to one another and will be typically formed simultaneously by common processing steps, it is very likely they will have virtually identical characteristics. With the balanced drive scheme of the present invention, only two diodes associated with each pixel need be substantially identical in order to ensure that the node between a diode pair will be at 0 volts when its storage element is being charged. This fact allows each pixel or storage element in the matrix to be charged to a known and repeatable voltage during each frame it is to be charged regardless of its location within the matrix, and even though the particular I-V characteristics of its diodes may vary from those of other storage elements in display systems. This permits improved gray scale operation in display systems, and should make it quite possible to implement at least fifteen levels of gray scale in, for example, large area active matrix displays of the twisted nematic liquid crystal type using normal fluorescent back illumination. The pixels can also be charged more rapidly since the retained charge in the diodes associated with each pixel when they are reverse biased need not be initially dissipated to charge the storage elements, because this charge is dissipated when the diodes are first forward biased. For example, in a high resolution display system having pixels can theoretically be charged in a charging time on the order of 100 nanoseconds, a time much shorter than is obtainable in a conventional transistor active matrix display using a thin film field effect transistor of the usual size as the active matrix element at each pixel.

Referring now to FIG. 4, it illustrates one storage location of another electronic matrix system embodying the present invention. Only one such storage location is illustrated inasmuch as it is exemplary of the many other storage locations which would comprise a complete electronic matrix system.

The storage location 72 includes a row select address line pair 74, 74', and an additional or column address line 76. As in the previous embodiment, the column address line 76 crosses the address line pair 74, 74' at an angle and is spaced therefrom forming a crossover point generally designated by the reference character 72. The storage location 72 includes a pair of threshold devices 78 and 80 which are coupled together at a common node 82 and between the row select lines 74 and 74'. The storage location 72 further includes a storage element 84 represented as a capacitor which includes a pair of electrodes 86 and 88.

The threshold devices 78 and 80 are illustrated by a symbol denoting that they are bidirectional threshold devices of the type disclosed in copending U.S. application Ser. Nos. 603,852, and 679,770, filed Apr. 25, 1984 and Dec. 10, 1984 respectively in the names of Willem den Boer, J. Scott Payson, and Zvi Yaniv for Programmable Semiconductor Switch For A Display Matrix Or The Like And Method For Making Same which are hereby incorporated herein by reference. As disclosed therein, the bidirectional threshold devices 78 and 80 can be formed from layers of deposited semiconductor materials, such as, amorphous semiconductor alloys. Preferably, the bidirectional threshold devices are formed from a pair of doped layers having a substantially intrinsic or lightly doped layer in between. Hence, these devices can take the form of NIN devices, N$\pi$N, wherein the intermediate layer is a lightly P doped layer, PIP devices, or P$\nu$P devices where the intermediate layer is a lightly N doped layer. Reference may be had to the aforementioned U.S. patent application Ser. Nos. 603,852 and 679,770 for additional details of the structure of the devices and the manner of making the same.

The bidirectional threshold devices are devices which have two thresholds, the thresholds being equal in magnitude but opposite in polarity. For example, the bidirectional threshold devices can have a threshold of 3.5 volts so that each of the devices are forward biased if a voltage of +3.5 volts or greater is impressed thereacross, or if a voltage equal to or more negative than −3.5 volts is impressed thereacross.

In utilizing bidirectional devices in accordance with the present invention, and referring to FIG. 4, during the time in which the charge storage element 84 is to be charged, a voltage more positive than 3.5 volts can be applied to the row address line 74 and a voltage more negative than −3.5 volts can be applied to the row address line 74'. This will cause current to flow through the bidirectional threshold devices 78 and 80 to facilitate the storage of charge within the charge storage element 84. When the charge storage element 84 is charged, the charge stored therein can be retained by applying voltages to the row address lines 74 and 74' which are less in magnitude and opposite in polarity and which have an absolute value less than 3.5 volts. For example, to facilitate charging of the charged storage element 84, a +4 volts could be applied to the row address line 74 and a −4 volts could be applied to the row address line 74'. To thereafter retain the stored charge, a +2 volts could be applied to the row address line 74 and a −2 volts could be applied to the row address line 74'. Alternatively, lines 74 and 74' could simply be placed or held at 0 volts, or even allowed to float at any voltage below the threshold voltage of the individual nonlinear threshold elements. Preferably, any voltages applied to the row address line pair should be equal in magnitude and opposite in polarity to assure that the voltage at node 82 remains substantially at 0 volts.

Referring now to FIG. 5, it illustrates the charge storage location 90 of another electronic matrix system embodying the present invention. Like the previous embodiments, the matrix includes a plurality of substantially parallel address line pairs such as row select lines 92 and 92' and a plurality of substantially parallel additional address or column lines such as column address line 94. The charge storage location 90 further includes a pair of threshold devices which take the form of field effect transistors 96 and 98. The transistors 96 and 98 are coupled in nonopposing series relation between the address line pair 92, 92' and at a common node 100. More specifically, the drain 102 of transistor 96 is coupled to line 92 and the source 104 is coupled to the common node 100. The drain 106 of transistor 98 is coupled to the common node 100 and the source 108 is coupled to the line 92'. The gate 110 of transistor 96 is coupled to its drain 102 and the gate 112 of transistor 98 is coupled to its drain 106. A charge storage element 114 is coupled between the common node 100 and the column address line 94.

The field effect transistors 96 and 98 are preferably formed in integrated form and preferably include a deposited semiconductor material such as an amorphous semiconductor alloy as the semiconductor of the devices. Details of how to construct such transistors are well-known to those in the art. For example, such details are provided in U.S. Pat. Nos. 4,543,320 and 4,547,789 and in U.S. patent application Ser. No. 702,996 filed Feb. 19, 1985 in the names of Zvi Yaniv, et al. for Active Display Matrix Addressable Without Crossed Lines On Any One Substrate And Method Of Using The Same. These patent references are hereby incorporated herein by reference. The transistors 96 and 98 could be either depletion mode field effect transistors or enhancement mode field effect transistors depending upon the circuits used to drive their gates.

If the transistors 96 and 98 N-channel are enhancement mode field effect transistors, the charge storage element 114 can be charged by the application of, for example, a +20 volts on line 92 and a −20 volts on line 92'. This combination of voltages which are equal in magnitude and opposite in polarity will "forward bias" that is turn on, the transistors 96 and 98 to facilitate the charging of the charge storage element 114 by the application of either a positive or negative voltage on the column address line 94. To facilitate the retention of the stored charge, the voltages applied to the address line pair 92, 92' can be reversed such that a −20 volts is applied to line 92 and a +20 volts is applied to line 92'. These voltages which are also equal in magnitude and opposite in polarity will bias the transistors 96 and 98 off to facilitate the retention of the charge stored in the charge storage element 114. Alternatively, lines 92 and 92' could be simply placed or held at 0 volts, or even allowed to float at any voltage below the gate threshold voltage at which the field effect transistors 96 and 98 begin to turn on.

As previously mentioned, the transistors 96 and 98 could also be depletion mode type field effect transistors. If such depletion mode transistors are employed, the foregoing voltages applied to the row select address line pair 92, and 92' will be reversed for facilitating the storage of charge in the charge storage element 114, and then the retention of the stored charge.

As can be seen from the foregoing, the present invention provides a new and improved electronic matrix system and method for rapidly storing and efficiently retaining electric charge in selected ones of a plurality of storage elements. Because the system incorporates balanced driving, a substantially zero voltage can be maintained at the common node between the threshold devices. Further, because both threshold devices are biased on during the charging of the charged storage element, sufficient charging currents can be obtained to enable rapid charging even at relatively low charging potentials.

We claim:

1. A method of operating an electronic matrix system to rapidly store and efficiently retain electric charge in selected ones of a plurality of storage elements of the matrix system, said method comprising the steps of:
    providing a plurality of substantially parallel address line pairs;
    providing a plurality of substantially parallel additional address lines crossing said address line pairs at an angle and being spaced from said address line pairs to form a plurality of crossover points therewith;
    coupling a pair of threshold devices together at a common node and in nonopposing series relation between said address line pairs and associated with said crossover points, said threshold devices being of the type which provide a low impedance to current flow when forward biased into an on condition;
    coupling each of said storage elements between a respective one of said common nodes and one of said additional address lines;
    applying first operating potentials which are substantially equal in magnitude and opposite in polarity between said address line pairs to bias said threshold devices into said on condition to facilitate the storage of charge in the storage elements coupled thereto; and
    applying charging potential to selected ones of said additional address lines during the application of said first operating potentials to said address line pairs to store electric charge in said selected storage elements.

2. A method as defined in claim 1 wherein said threshold devices are also of the type which provide a high impedance to current flow when reverse biased into an off condition, and wherein said method further includes the step of applying second operating potentials which are substantially equal in magnitude and opposite in polarity between said address line pairs to reverse bias said threshold devices into said off condition to facilitate the retention of the charge stored in said storage elements coupled thereto.

3. A method as defined in claim 1 wherein said matrix comprises a display adapted to influence the intensity, phase or polarization of light, wherein said storage elements comprise pixels of said display including a light influencing material, and wherein said step of applying said charging potential includes applying sufficient charging potential to actuate said light influencing material.

4. A method as defined in claim 3 wherein said light influencing display comprises a liquid crystal display and wherein said method further includes providing a pair of electrodes for each said pixel and applying liquid crystal display material between said electrodes.

5. A method as defined in claim 1 wherein said threshold devices comprise diodes.

6. A method as defined in claim 5 further including the step of forming said diodes by depositing layers of semiconductor materials.

7. A method as defined in claim 6 wherein said semiconductor materials are amorphous semiconductor alloys.

8. A method as defined in claim 6 wherein said diodes are formed by depositing a first layer of doped semiconductor material, depositing a layer of substantially intrinsic semiconductor material over said first doped layer of semiconductor material, and depositing a second layer of doped semiconductor material over said substantially intrinsic layer of semiconductor material.

9. A method as defined in claim 8 further including the step of doping said first and second doped layers of semiconductor material so that said first and second doped layers are opposite in conductivity.

10. A method as defined in claim 1 wherein said threshold devices comprises bidirectional threshold devices.

11. A method as defined in claim 10 further including the step of forming said bidirectional threshold devices by depositing layers of semiconductor material.

12. A method as defined in claim 11 wherein said semiconductor materials are amorphous semiconductor alloys.

13. A method as defined in claim 11 wherein said bidirectional threshold devices are formed by depositing a first layer of semiconductor material, depositing a second layer of semiconductor material over said first layer, and depositing a third layer of semiconductor material over said second layer.

14. A method as defined in claim 13 further including the steps of doping said first and third layers of semiconductor materials.

15. A method as defined in claim 14 wherein said first and third layers of said bidirectional threshold devices are doped to be of the same conductivity type.

16. A method as defined in claim 15 wherein said second layer is substantially intrinsic.

17. A method as defined in claim 15 including the further step of lightly doping said second layer to have a conductivity opposite the conductivity of said first and third layers.

18. A method as defined in claim 1 wherein said threshold devices comprise transistors.

19. A method as defined in claim 18 wherein said transistors are field effect transistors.

20. A method as defined in claim 1 wherein said step of applying said first operating potentials includes commencing the application of said first operating potentials after commencing the application of said charging potentials and terminating the application of said first operating potentials before terminating the application of said charging potentials.

* * * * *